United States Patent
Wang

(10) Patent No.: US 9,117,518 B2
(45) Date of Patent: Aug. 25, 2015

(54) NON-VOLATILE REGISTER AND NON-VOLATILE SHIFT REGISTER

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 219 days.

(21) Appl. No.: 13/724,623

(22) Filed: Dec. 21, 2012

(65) Prior Publication Data

US 2014/0177348 A1    Jun. 26, 2014

(51) Int. Cl.
*G11C 14/00* (2006.01)
*G11C 19/28* (2006.01)

(52) U.S. Cl.
CPC ............ *G11C 14/0063* (2013.01); *G11C 14/00* (2013.01); *G11C 14/0054* (2013.01); *G11C 19/28* (2013.01)

(58) Field of Classification Search
CPC . G11C 14/00; G11C 14/0054; G11C 14/0063
USPC ................... 365/185.08, 185.05, 78
See application file for complete search history.

(56) References Cited

U.S. PATENT DOCUMENTS

| | | | | |
|---|---|---|---|---|
| 5,353,248 | A * | 10/1994 | Gupta | 365/154 |
| 6,222,765 | B1 * | 4/2001 | Nojima | 365/185.08 |
| 6,400,599 | B1 * | 6/2002 | Voss | 365/154 |
| 6,556,487 | B1 * | 4/2003 | Ratnakumar et al. | 365/154 |
| 7,031,189 | B2 * | 4/2006 | Pascucci | 365/185.08 |
| 7,242,614 | B2 * | 7/2007 | Diorio et al. | 365/185.08 |

* cited by examiner

*Primary Examiner* — Vanthu Nguyen
(74) *Attorney, Agent, or Firm* — Muncy, Geissler, Olds & Lowe, P.C.

(57) ABSTRACT

Non-Volatile Register (NVR) and Non-Volatile Shift Register (NVSR) devices are disclosed. The innovative NVR and NVSR devices of the invention can rapidly load the stored non-volatile data in non-volatile memory elements into their correspondent static memory elements for fast and constant referencing in digital circuitry. According to the invention, the loading process from non-volatile memory to static memory is a direct process without going through the conventional procedures of accessing the non-volatile memory, sensing from the non-volatile memory, and loading into the digital registers and shift registers.

17 Claims, 9 Drawing Sheets

NON-VOLATILE REGISTER AND NON-VOLATILE SHIFT REGISTER

BACKGROUND OF THE INVENTION

1. Field of the Invention

The invention relates to Non-Volatile Register (NVR) and Non-Volatile Shift Register (NVSR) devices in digital circuitry. In particular, the NVR and NVSR devices of the invention can directly load non-volatile digital information into the registers for fast and constantly referencing.

2. Description of the Related Art

In digital circuitry, registers and shift registers are broadly applied for storing small amount digital information for fast and constantly referencing. A common property of computer programs is locality of reference: the same values are often accessed repeatedly and frequently used values held in registers improve performance. This is what makes fast registers meaningful in contrast to the general data accessed from the main memory units. For building the register and shift register in a digital circuitry the main static memory element of the conventional register and shift register is usually constructed by a pair of cross-connected MOSFET (Metal-Oxide-Semiconductor-Field-Effect-Transistor) invertors 111 and 112 as the circuit schematics shown in FIG. 1. As the digital representation of core voltage $V_{DD}$ for "1" and ground voltage $V_{SS}$ for "0" in digital circuitry, one bit of stored digital information is sensed by the voltage potentials at the output node Q of the crossed inverters 111 and 112 in the register device as in FIG. 1. The digital information stored in a plurality of registers can be directly read out from their outputs in parallel. Or reducing the numbers of each individual output nodes to a single output node of a series of registers, the shift registers are designed to shift the digital data from one register to the next neighbor register by a clock sequence. The series bits of digital information stored in shift registers are sequentially sent out from the output port of the lead register.

Registers are normally measured by the number of bits they can hold, for example, an "8-bit register" or a "32-bit register". Registers are also categorized as processor registers and memory registers according to their applications for Computing Process Unit (CPU) and memory units, respectively. A processor often contains several kinds of registers classified accordingly to their content or instructions. For example, floating point and constant registers store floating point numbers and numerical constants; vector registers hold data for vector processing done by single instruction multiple data; conditional registers hold truth values often used to determine whether some instructions should or should not be executed; control and status registers are applied for program counters, instruction registers and program status words. Meanwhile the memory registers such as buffer register, data registers, address registers, and type range registers fetch data from RAM (Random Addressable Memory).

Although the data inside the conventional registers and shift registers can be fast and constantly accessed, the stored data disappear after the chip power is turned off, that is, the stored data in the conventional registers and shift registers are volatile. When a digital circuitry is turned on, the initial data in the registers must be loaded either from an on-chip non-volatile memory unit such as ROM (Read Only Memory) and EEPROM (Electrical Erasable Programmable Read Only Memory), or from external memory units. The conventional data fetching process for registers would require the time to read out the data from a memory unit and the time to load the fetched data into the registers, resulting in performance degradation. The data fetch process also requires more chip power from the non-volatile memory sensing circuitry. Therefore, it will be very desirable for registers to load non-volatile data directly without going through the conventional data fetching process from non-volatile memory units to improve the performance of register and to save chip power from non-volatile memory data sensing.

In this invention, we have developed Non-Volatile Register (NVR) and Non-Volatile Shift Register (NVSR) based on the previously developed Non-Volatile Static Random Access Memory (U.S. patent application Ser. No. 13/206,270, the disclosure of which is incorporated herein by reference in its entirety). The NVR and NVSR of the invention can directly load non-volatile data from semiconductor non-volatile memory elements to their correspondent static memory elements (cross-connected inverters) without going through a readout process from a non-volatile memory. When a digital circuitry embedded with the NVR and NVSR is "on", the non-volatile data are immediately loaded to the correspondent static memory elements in the registers. The data in the NVR and NVSR are then ready for fast and constantly referencing for the digital circuitry.

SUMMARY OF THE INVENTION

According to an embodiment, an N-type Non-Volatile Register (NVR) cell 200 consists of a static memory element 210, an N-type semiconductor non-volatile memory element 220, and an N-type reset MOSFET 230 shown in FIG. 2. Two cross-connected MOSFET inverters $MP_0$-$MN_0$ 211 and $MP_1$-$MN_1$ 212 form the static memory element 210. The data output terminal Q is located at the node 214 between $MID_1$ and $MN_1$ of the inverter 212. The source and drain electrodes of the N-type reset MOSFET 230 are connected to the ground voltage $V_{SS}$ and the output node Q respectively. The gate electrode 231 of the N-type MOSFET 230 is the input terminal for a "reset" signal to reset the output node Q to the ground voltage potential $V_{SS}$. A first source/drain electrode and a second source/drain electrode of the N-type semiconductor non-volatile memory element 220 are connected to the node 213 between $MP_0$ and $MN_0$ of inverter 211 and an external terminal D 221, respectively. The control gate of the N-type semiconductor non-volatile memory element 220 is connected to an external terminal CG 222.

In the operations of the NVR cell 200, the non-volatile data "0" and "1" are represented by the programmed high threshold voltage state $V_{thH}$ and the erased low threshold voltage $V_{thL}$ of the N-type semiconductor non-volatile memory element 220 respectively. When a control gate voltage bias $V_{CG}$ for $V_{thH} > V_{CG} > V_{thL}$ is applied to the control gates of a plurality of the N-type semiconductor non-volatile memory elements 220 through the external terminal CG 222 with the second source/drain electrodes connected to the external terminal D applied with the ground voltage $V_{SS}$, the N-type semiconductor non-volatile memory elements at low threshold voltage state $V_{thL}$ are "on" to pull down the voltage potentials at the nodes 213 of the inverters 211 to the ground voltage $V_{SS}$. While the N-type semiconductor non-volatile memory elements at high threshold voltage state $V_{thH}$ are "off" to retain the voltage potentials at the nodes 213 of the inverters 211.

Upon digital circuit power-on for loading the non-volatile data to a plurality of NVR cells, a "reset" signal of the digital "high" voltage $V_{DD}$ is initially applied to the gate electrodes 231 of the N-type MOSFET devices 230 to reset the voltage potentials at the output nodes Q 214 to the ground voltage $V_{SS}$ ("0") and the voltage potentials at the complementary nodes 213 to the digital "high" voltage $V_{DD}$. After the reset procedure, the set procedure takes place by applying a control gate voltage bias $V_{CG}$ for $V_{thH} > V_{CG} > V_{thL}$ to the control gate electrodes and the ground voltage $V_{SS}$ to the second source/drain electrodes of N-type semiconductor non-volatile memory elements 220 respectively. Consequently the N-type semiconductor non-volatile memory elements at the low threshold voltage state $V_{thL}$ are then "on" to pull down the initial voltage $V_{DD}$ to the ground voltage $V_{SS}$ at the complementary nodes 213 leading to the voltage potential at the output nodes Q 214 changed from the ground voltage $V_{SS}$ ("0") to the digital "high" voltage $V_{DD}$ ("1"). The non-volatile data "1" stored in the N-type non-volatile memory elements with the low threshold voltage are then loaded into their correspondent static memory elements with digital data "1" in NVR cells. Meanwhile since the N-type semiconductor non-volatile memory elements at high threshold voltage state $V_{thH}$ are "off" to retain the initial voltage potential $V_{DD}$ at the complementary nodes 213, the voltage potentials at the output nodes Q 214 remain the same ground voltage $V_{SS}$ ("0"). The non-volatile data "0" stored in the N-type non-volatile memory elements with the high threshold voltage are then equivalent to the initial digital value "0" in their correspondent static memory elements in NVR cells. Therefore, the set procedure completes loading the non-volatile data from the non-volatile memory elements into their correspondent static memory elements in NVR cells.

After the non-volatile data are loaded to the static memory elements in a plurality of NVR cells, the digital data information can be referenced either directly from the output node Q of each individual NVR cell in parallel or from a single output port in series by a clock sequence as for the conventional shift registers. The schematic of a NVSR cell 300 where two transmission gate devices 340 and 350 are added to the register is shown in FIG. 3. When a "high" clock signal and its "low" complementary signal are applied to the node 360 and node 361, the digital signals at the input node 341 of the transmission gate device 340 are passed to the output node 342 connected to the gate of inverter 311 and propagated to the output node 352 of inverter 312 with the transmission gate device 350 "off" to disconnect the output signal at the output node 352 from the gate of inverter 311. When the clock signal goes "low", the transmission gate 340 is "off" to cut off the input signal (at the input node 341) and the transmission gate 350 is "on" to latch the digital value in the cross-connected inverters 311 and 312.

FIG. 4a shows the schematic of a P-type non-volatile register cell according to the invention. A P-type non-volatile register cell 400a consists of a static memory element 410, a P-type semiconductor non-volatile memory element 420, and a P-type reset MOSFET 430 as shown in FIG. 4a. The P-type semiconductor non-volatile memory element 420 can be programmed to a high threshold voltage state $V_{thH}$ (toward more positive) by injecting electrons to the storing material and erased to a low threshold voltage state $V_{thL}$ (toward more negative) by removing the stored electrons or slightly injecting holes. The non-volatile data "0" and "1" are represented by the high threshold voltage state $V_{thH}$ and the low threshold voltage state $V_{thL}$, respectively. A first source/drain electrode and a second source/drain electrode of the P-type semiconductor non-volatile memory element 420 are connected to the node 413 between $MP_0$ and $MN_0$ of inverter 411 and an external terminal S 421, respectively. When a digital "high" voltage $V_{DD}$ is applied to the control gate electrode 422, the external terminal S 421, and the well electrode 423 of the P-type semiconductor non-volatile memory element 420, the P-type semiconductor non-volatile memory element with high threshold voltage state $V_{thH}$ is always "on" to pass $V_{DD}$ to pull up the complementary node 413, resulting in ground voltage potential $V_{SS}$ at the register output node Q 414. The P-type semiconductor non-volatile memory element with low threshold voltage $V_{thL}$ is "off" with gate, source, and well electrodes biased at the digital "high" voltage $V_{DD}$ as the standard P-type MOSFET operation. The P-type semiconductor non-volatile memory element in the high threshold voltage state can be turned off by applying a control gate voltage $V_{CG} > V_{thH}$ with source and well electrodes biased at the digital "high" voltage $V_{DD}$.

Upon digital circuit power on for loading the non-volatile data to the P-type NVR cells 400a, a "reset" signal, the digital "low" voltage $V_{SS}$, is initially applied to the gate electrodes 431 of the P-type MOSFET devices 430 to reset the voltage potentials at the output nodes Q 414 to the digital "high" voltage $V_{DD}$ ("1") and the voltage potentials at the complementary nodes 413 to the digital "low" voltage $V_{SS}$. After the reset procedure, the set procedure takes place by applying the digital "high" voltage bias $V_{DD}$ to the control gate electrodes, the second source/drain electrodes, and well electrodes of the P-type semiconductor non-volatile memory elements 420 respectively. Consequently the P-type semiconductor non-volatile memory elements at the high threshold voltage state $V_{thH}$ are then "on" to pull up the initial ground voltage $V_{SS}$ to the voltage $V_{DD}$ at the complementary nodes 413 leading to the voltage potential at the output node Q 414 changed from the digital "high" voltage $V_{DD}$ ("1") to the ground voltage $V_{SS}$ ("0"). The non-volatile data "0" stored in the P-type non-volatile elements in the high threshold voltage state are then loaded into their correspondent static memory elements with digital data "0" in NVR cells 400a. Meanwhile since the P-type semiconductor non-volatile memory elements at the low threshold voltage state $V_{thL}$ are "off" to retain the initial ground potential $V_{SS}$ at the complementary nodes 413, the voltage potentials at the output nodes Q 414 remain the same digital "high" voltage $V_{DD}$ ("1"). The non-volatile data "1" stored in the P-type non-volatile elements with the low threshold voltage states are then equivalent to the initial digital value "1" in their correspondent static memory elements in NVR cells. Therefore, the set procedure completes loading the non-volatile data from the non-volatile memory elements to their correspondent static memory elements in NVR cells.

After the non-volatile data are loaded to the static memory elements in a plurality of NVR cells, the digital data information can be referenced either directly from the output node Q of each individual NVR cell in parallel or from a single output port in series by a clock sequence as for the conventional shift registers. The schematic of a NVSR cell 400b where two transmission gate devices 440 and 450 are added to the register is shown in FIG. 4b. When a "high" clock signal and its "low" complementary signal are applied to the node 460 and node 461, the digital signals at the input node 441 of the transmission gate device 440 are passed to the output node 442 connected to the gate of inverter 411b and propagated to the output node 452 of inverter 412b with the transmission gate device 450 "off" to disconnect the output signal at the output node 452 from the gate of inverter 411b. When the clock signal goes "low", the transmission gate 440 is "off" to cut off the input signal (at the input node 441) and the transmission gate 450 is "on" to latch the digital value in the cross-connected inverters 411b and 412b.

BRIEF DESCRIPTION OF THE DRAWINGS

For a better understanding of the present invention and to show how it may be carried into effect, reference will now be made to the following drawings, which show the preferred embodiment of the present invention, in which.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1:
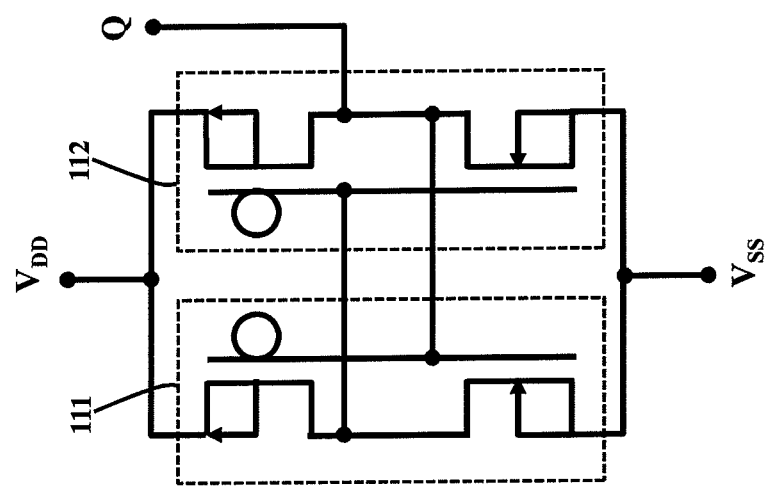
FIG. 1 shows the schematic of the static memory element in the conventional register.
Figure 2:
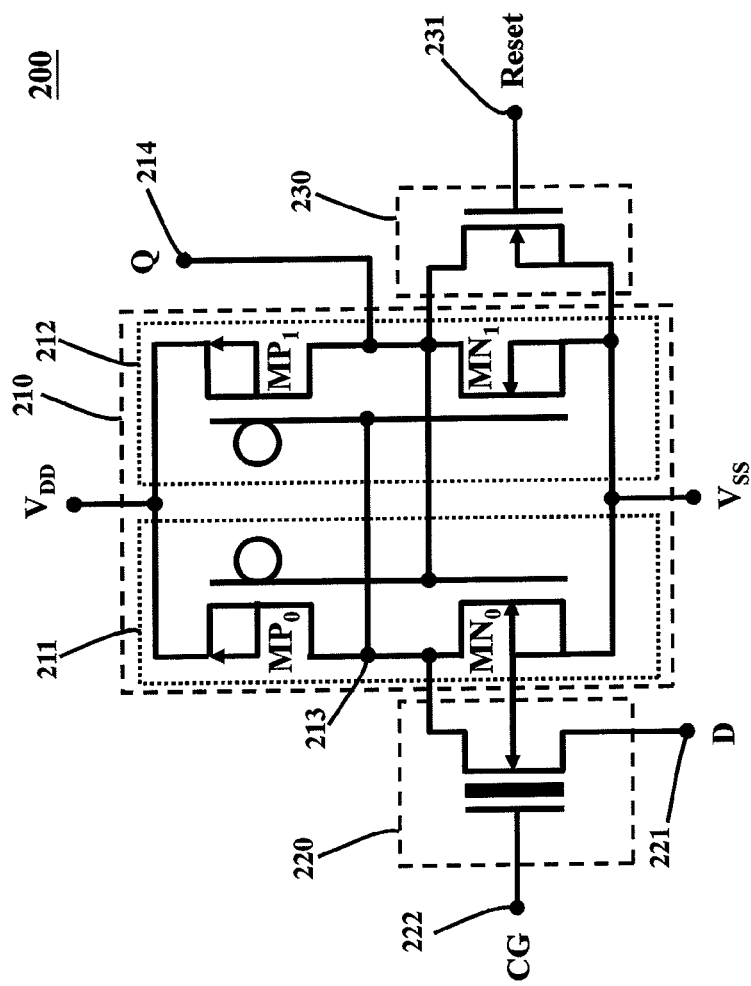
FIG. 2 shows the schematic of an N-type non-volatile register cell according to this invention.
Figure 3:
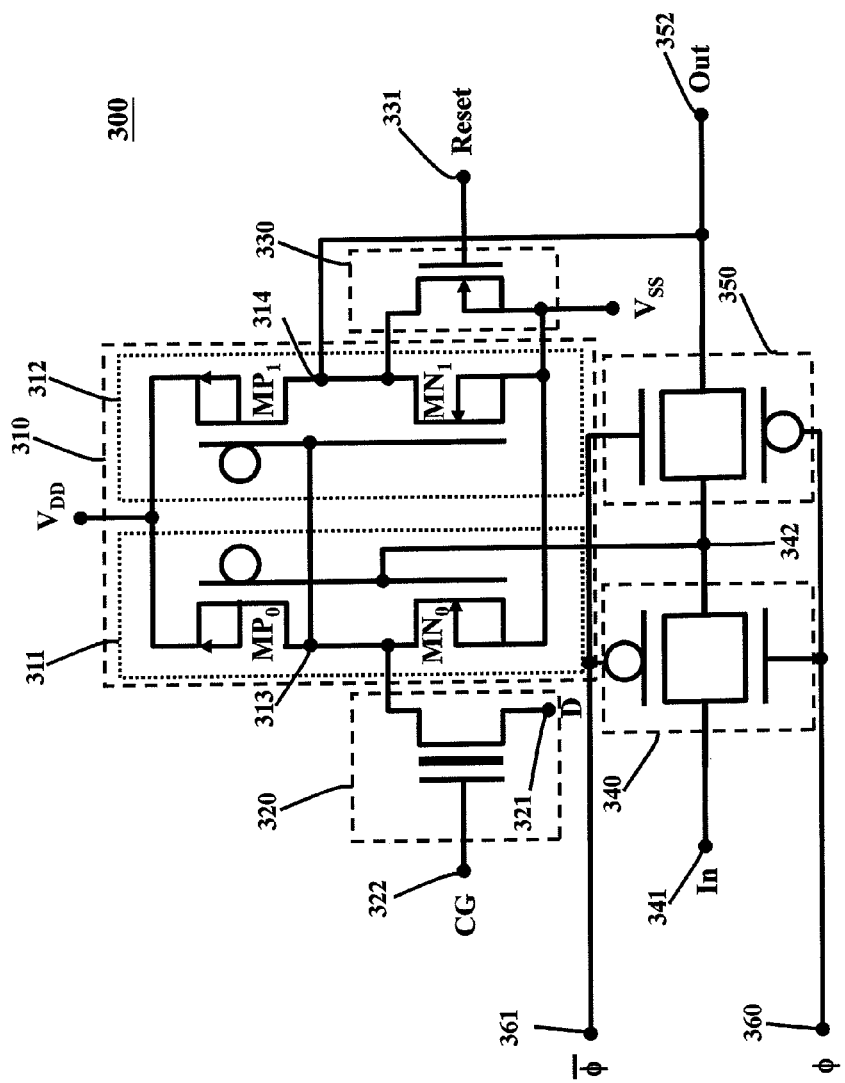
FIG. 3 shows the schematic of an N-type non-volatile shift register cell according to this invention.
Figure 4A:
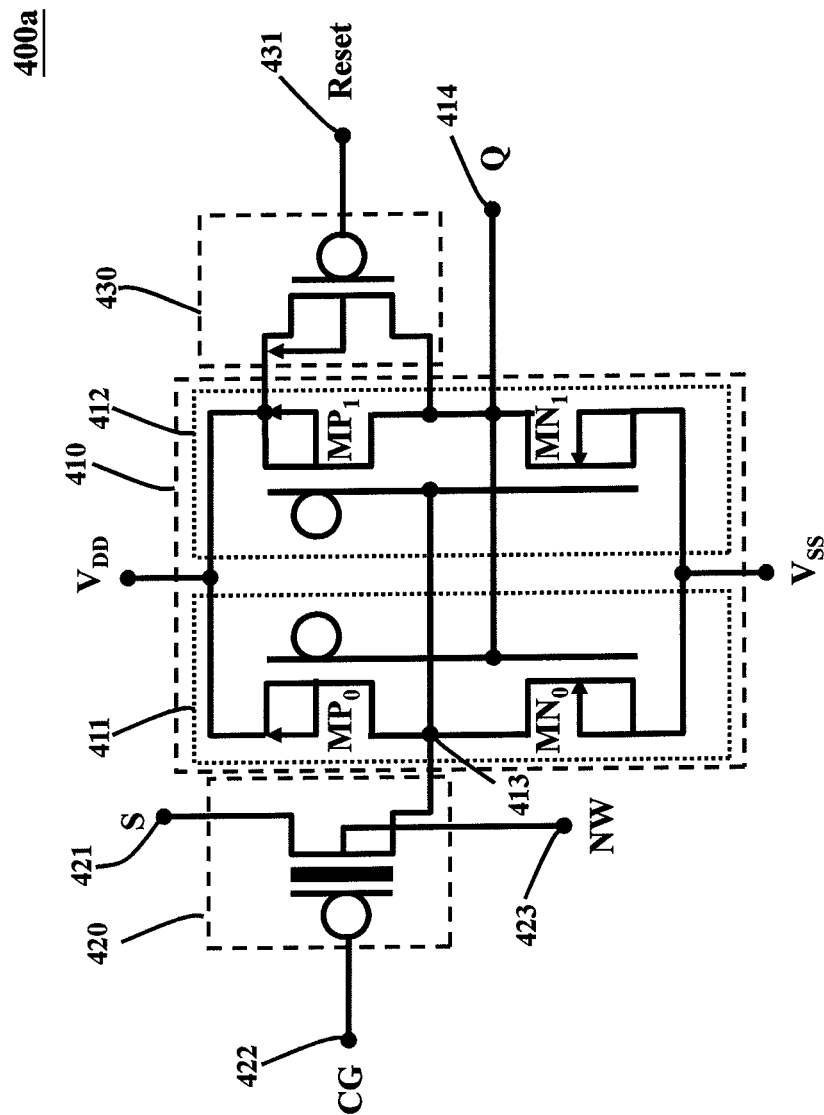
FIG. 4a shows the schematic of a P-type non-volatile register cell according to this invention.
Figure 4B:
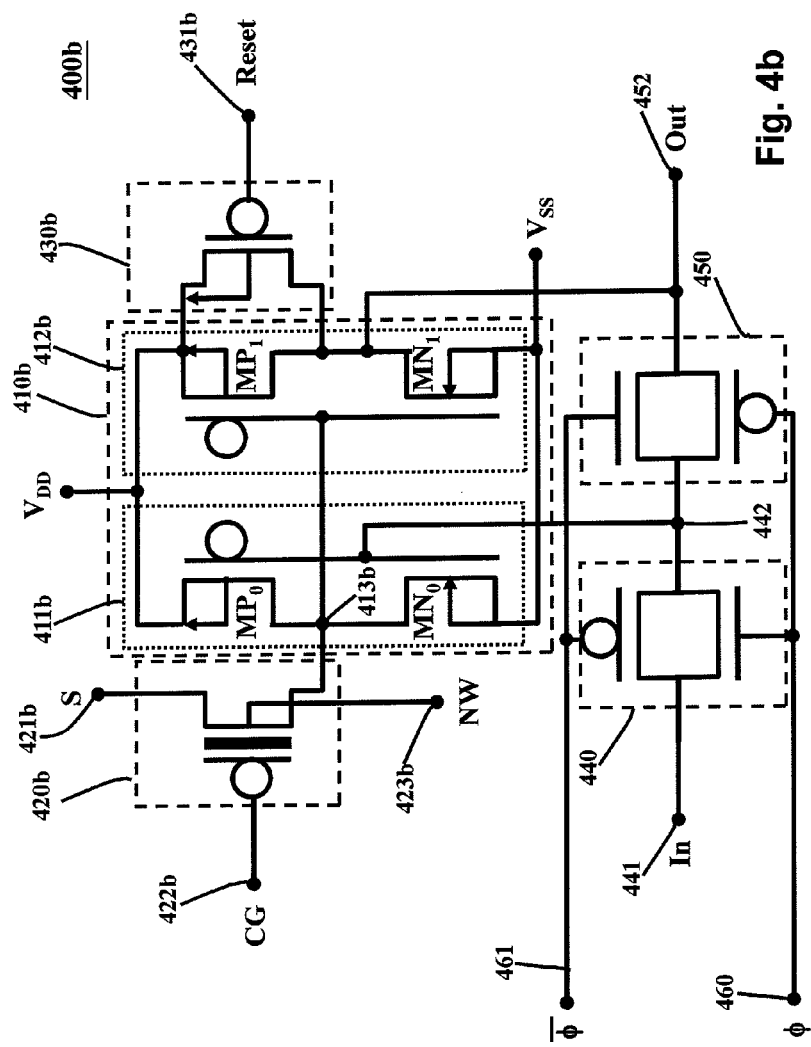
FIG. 4b shows the schematic of a P-type non-volatile shift register cell according to this invention.
Figure 5:
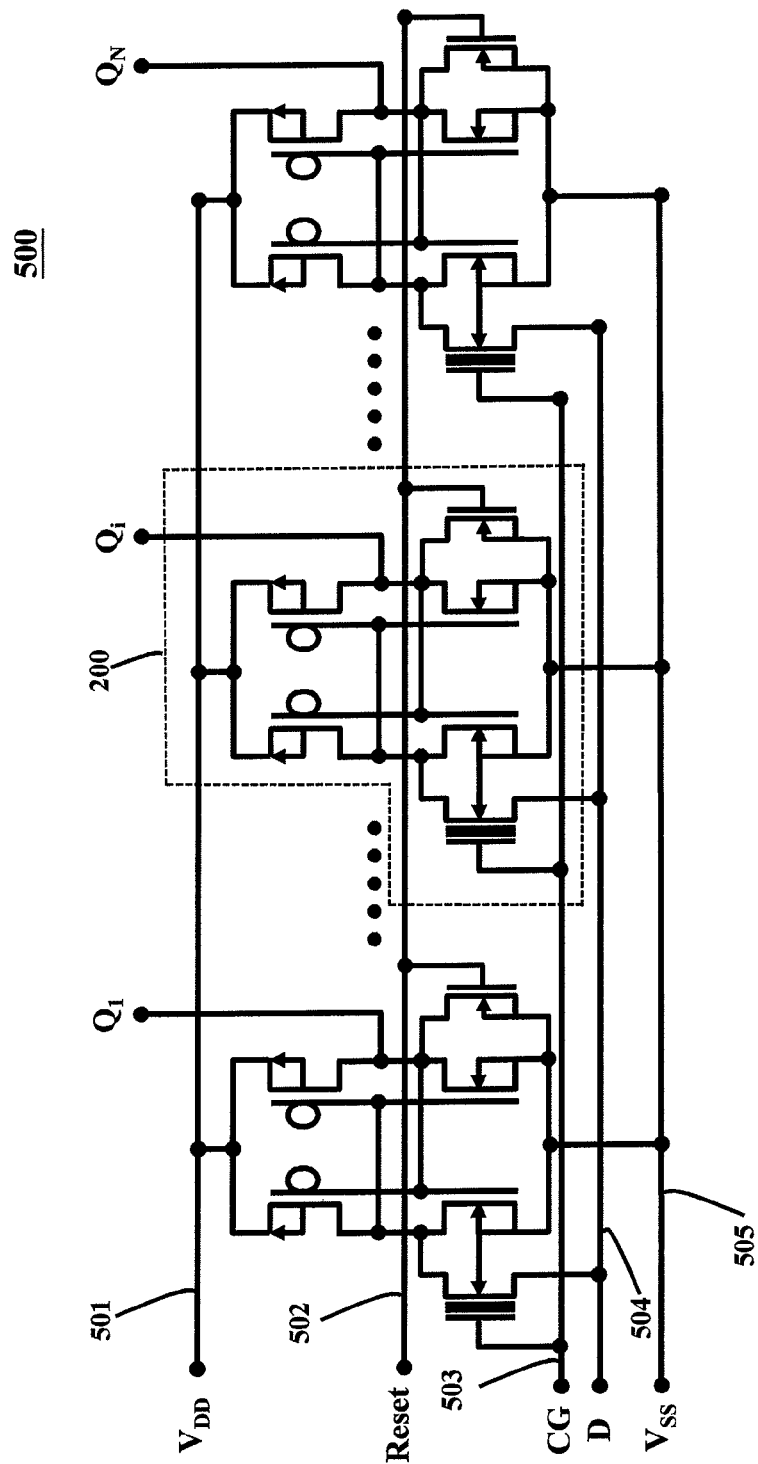
FIG. 5 shows the schematic of an N-bit Non-Volatile register (NVR) according to an embodiment of the invention.

According to a preferred embodiment of an N-bit NVR 500, a number of NVR cells 200 equal to N are arranged in a row as shown in FIG. 5. The digital power rails forming the positive voltage line $V_{DD}$ 501 and ground voltage line $V_{SS}$ 505 are connected to the $V_{OD}$ terminals and $V_{SS}$ terminals of the NVR cells 200 respectively. For the NVR cells 200 in the N-bit NVR 500, the gates of N-type MOSFET devices 230 are connected to form a reset line 502 and the control gates of the N-type semiconductor non-volatile memory elements 220 are connected to form a CG line 503. The second source/drain electrodes of the N-type semiconductor non-volatile memory elements 220 are connected altogether to form a D line 504. The N-bit register data output in parallel from the terminals Qi, for i=1 ... N.

Figure 6:
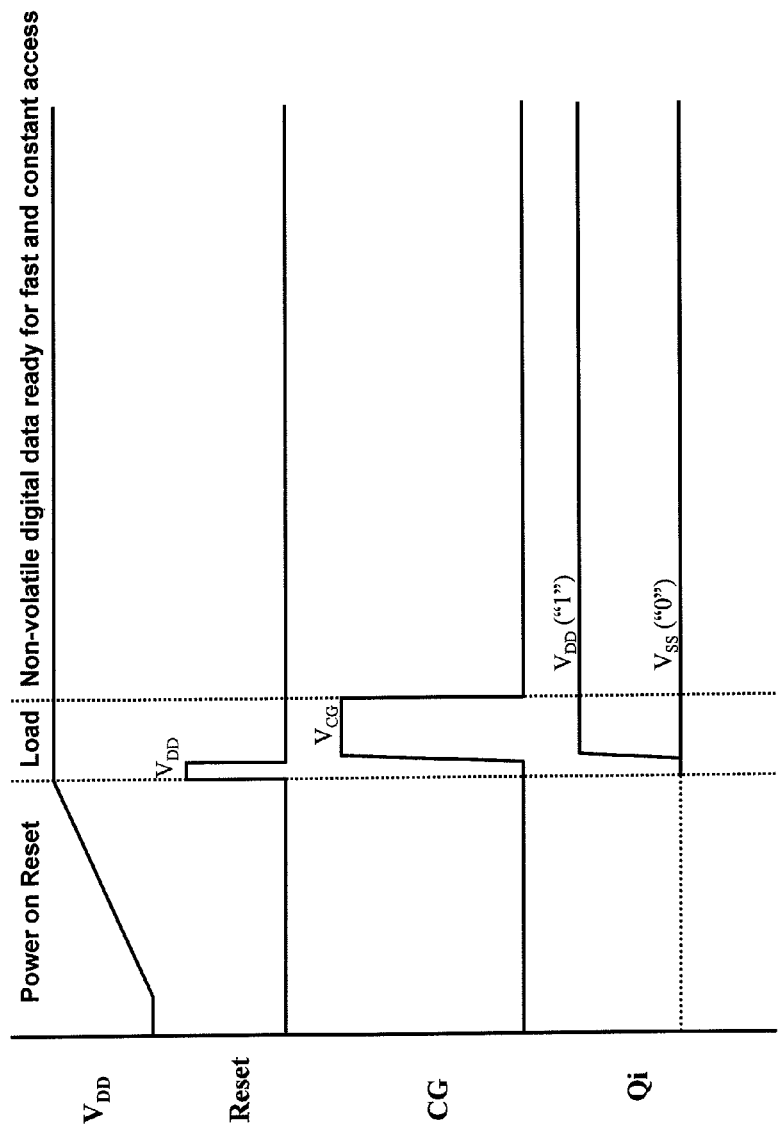
FIG. 6 shows the timing sequence for the operations of the N-bit NVR.

FIG. 6 shows the timing sequence of the operations of the N-bit NVR. Upon the completion of chip power on reset for a digital circuitry, all the NVR cells 200 in the N-bit NVR 500 are reset to an initial value "0" ($V_{SS}$ at the output nodes Qi of NVR cells 200) by applying a voltage pulse with amplitude $V_{DD}$ for nanoseconds to the reset line 502. To load non-volatile data from the non-volatile memory elements 220 to their correspondent static memory elements 210 in the N-bit NVR 500, the CG line 503 is applied with a voltage pulse $V_{CGH}$ for $V_{thH}>V_{CGH}>V_{thL}$ for a duration of several nanoseconds while the D line 504 is attached to the ground voltage $V_{SS}$. The non-volatile memory elements with the low threshold voltage $V_{thL}$ (having the non-volatile data "1") are "on" to set data "1" in their correspondent static memory elements in the "N" NVR cells.

Meanwhile the non-volatile memory elements with high threshold voltage $V_{thH}$ (having the non-volatile data "0") are "off" to retain the initial data "0" in their correspondent static memory elements in the "N" NVR cells. After the set process, the N-bit NVR 500 loaded with the stored non-volatile data are ready for fast and constant referencing.

Figure 7:
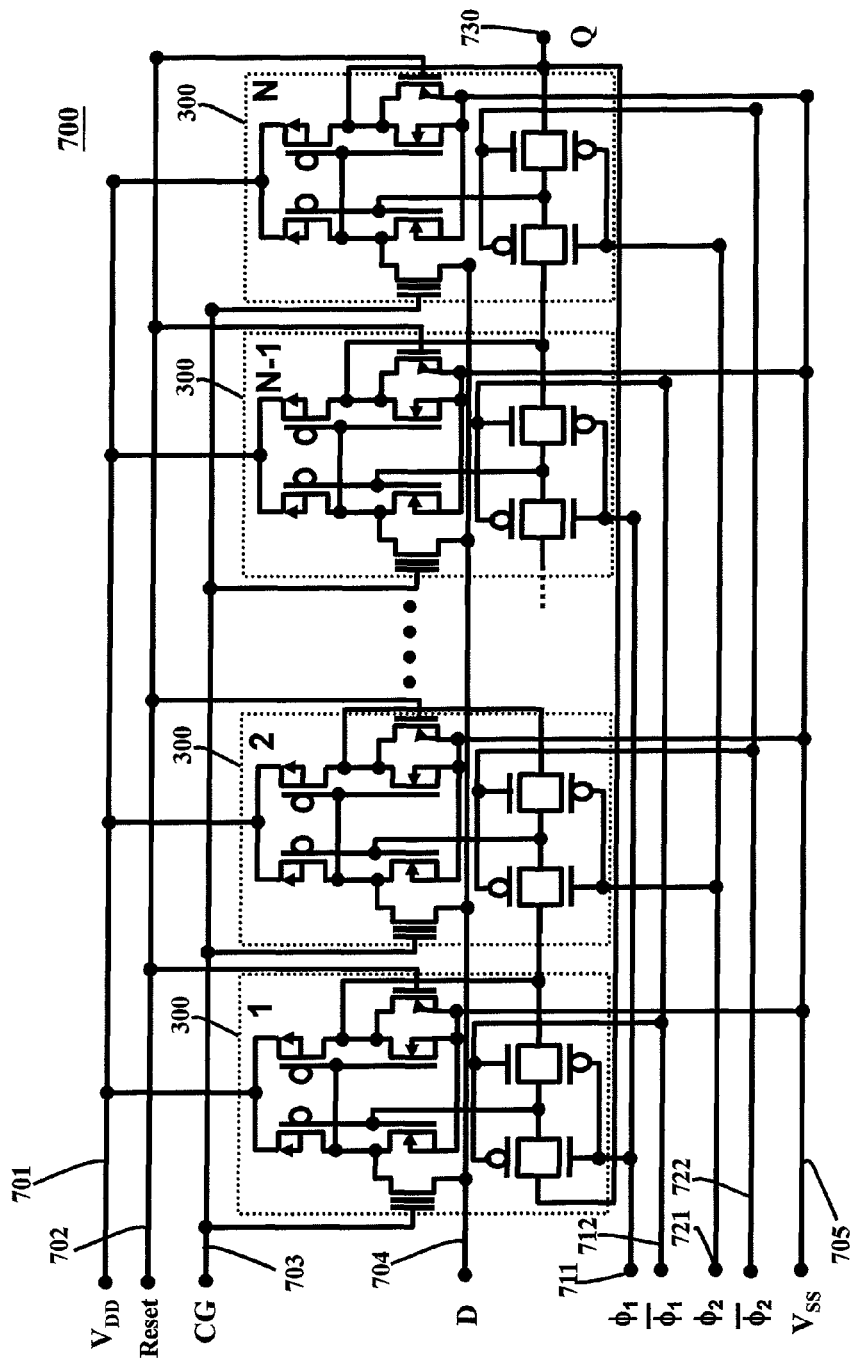
FIG. 7 shows the schematic of an N-bit Non-Volatile Shift Register (NVSR) according to an embodiment of the invention.

In a preferred embodiment of an N-bit NVSR 700, a number of NVSR cells 300 equal to N are arranged in a row in FIG. 7. The digital power rails forming the positive voltage line $V_{DD}$ 701 and ground voltage line $V_{SS}$ 705 are connected to the $V_{DD}$ terminal and $V_{SS}$ terminal of each NVSR cell 300, respectively. For the NVSR cells 300 in the N-bit NVSR 700, the gates of N-type MOSFET devices 330 are connected to form a reset line 702 and the control gates of the N-type semiconductor non-volatile memory elements 320 are connected to form a CG line 703. The second source/drain electrodes of the N-type semiconductor non-volatile memory elements 320 are connected to form a D line 704.

The first clock signals $\phi_1$ 711 and its complementary signal /$\phi_1$ 712 are applied to the transmission gates of the odd numbers of NVSR cells and the second clock signals $\phi_2$ 721 and its complementary signal /$\phi_2$ 722 are applied to the transmission gates of the even numbers of NVSR cells in the N-bit NVSR 700. The series data output Q 730 of the N-bit NVSR 700 is the output node of the $N^{th}$ NVSR cell.

Figure 8:
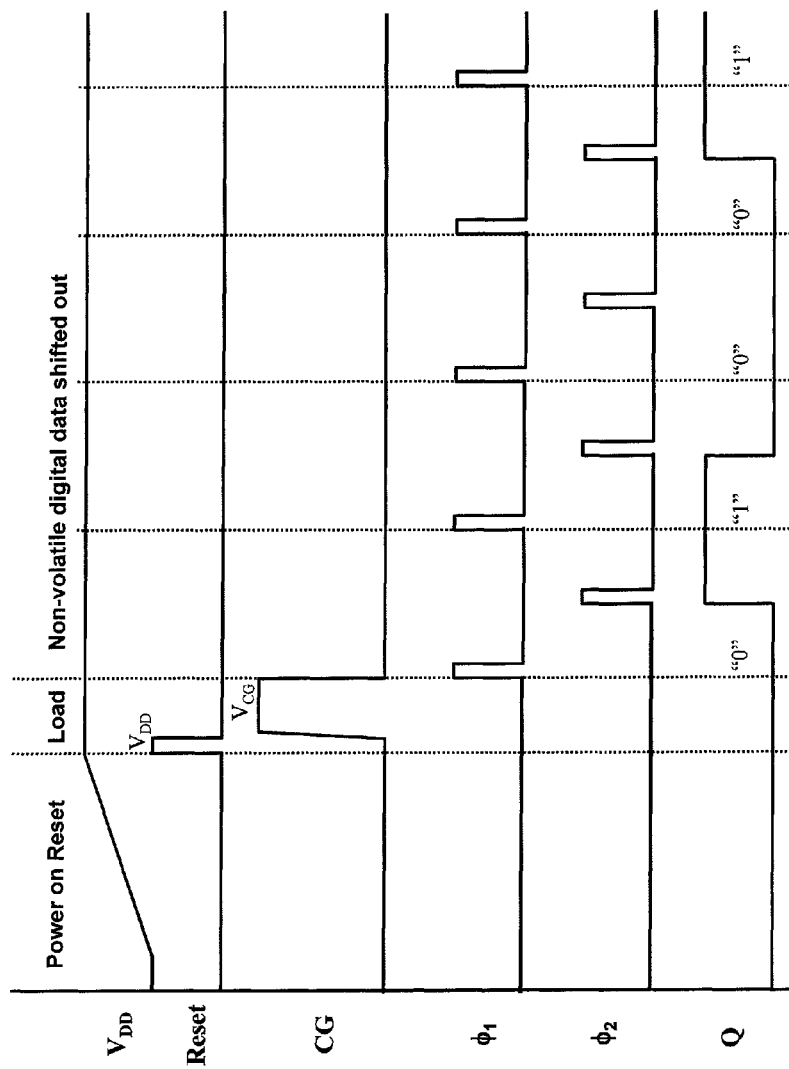
FIG. 8 shows the timing sequence for the operations of the N-bit NVSR.

FIG. 8 shows the timing sequence of the operations the N-bit NVSR. Upon the completion of chip power on reset for a digital circuitry, all the NVSR cells 300 in the N-bit NVSR 700 are reset to an initial value "0" ($V_{SS}$ at all the output nodes 352 of NVSR cells 300) by applying a voltage pulse with amplitude $V_{DD}$ for nanoseconds to the reset line 702. To load non-volatile data from the non-volatile memory elements 320 to their correspondent static memory elements 310 in the N-bit NVSR 700, the CG line 703 is applied with a voltage pulse $V_{CGH}$ for $V_{thH}>V_{CGH}>V_{thL}$ for a duration of several nanoseconds while with D line 704 attached to the ground voltage $V_{SS}$. The non-volatile memory elements with the low threshold voltage $V_{thL}$ (having the non-volatile data "1") are "on" to set data "1" in their correspondent static memory elements in the "N" NVSR cells 300. Meanwhile the non-volatile memory elements with the high threshold voltage $V_{thH}$ (having the non-volatile data "0") are "off" to retain the initial data "0" in their correspondent static memory elements in the "N" NVSR cells 300. After the set process, the loaded non-volatile data can be shifted out in series by activating the two clock signal sequences $\phi_1$ and $\phi_2$ separated by half cycle as shown in FIG. 8. The non-volatile data is sequentially sensed at the output node Q 730 of the N-bit NVSR 700.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of non-volatile memory elements including the types of non-volatile memory device made of different charge storing material and the types of reset transistors will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A non-volatile shift register cell, comprising:
   a latch having at least an input node, a first output node and a second output node, the input node and the first output node being complementary to each other;
   a non-volatile memory (NVM) element having a charge storing material, a control gate electrode, a first source/drain electrode and a second source/drain electrode, the first source/drain electrode being coupled to the first output node;
   a reset transistor coupled to the second output node; and
   a first switch and a second switch connected in series at an intermediate node and controlled by a clock signal, the intermediate node being coupled to the input node, an output terminal of the two switches being coupled to the second output node.

2. The non-volatile shift register cell according to claim 1, wherein the first switch is enabled to pass an input voltage at an input terminal of the two switches to the intermediate node and the second switch is disabled in response to a first state of the clock signal, and wherein the second switch is enabled to connect the intermediate node to the second output node and the first switch is disabled in response to a second state of the clock signal.

3. The non-volatile shift register cell according to claim 2, wherein when the first switch is enabled and the second switch is disabled, the second output node generates the input voltage, and wherein when the first switch is disabled and the second switch is enabled, the input voltage is isolated from the latch.

4. The non-volatile shift register cell according to claim 1, wherein when the reset transistor is N-type, the reset transistor is coupled between the second output node and a ground node carrying a ground voltage, otherwise the reset transistor is coupled between the second output node and an operating node carrying an operating voltage.

5. The non-volatile shift register cell according to claim 4, wherein the second output node is reset to a predetermined voltage when a gate voltage is applied to a gate electrode of the reset transistor.

6. The non-volatile shift register cell according to claim 5, wherein when the reset transistor is N-type, the gate voltage is the operating voltage and the predetermined voltage is the ground voltage, and wherein when the reset transistor is P-type, the gate voltage is the ground voltage and the predetermined voltage is the operating voltage.

7. The non-volatile shift register cell according to claim 1, wherein when the NVM element is N-type, a control gate voltage is applied to the control gate electrode and the second source/drain electrode is coupled to a ground node carrying a ground voltage to load an non-volatile value from the NVM element into the latch, and wherein the control gate voltage is between a programmed threshold voltage and an erased threshold voltage of the NVM element.

8. The non-volatile shift register cell according to claim 1, wherein when the NVM element is P-type, an operating node carrying an operating voltage is coupled to the control gate electrode, the second source/drain electrode and a well electrode of the NVM element to load an non-volatile value from the NVM element into the latch.

9. The non-volatile shift register cell according to claim 1, wherein after the second output node is reset and then an non-volatile value is loaded from the NVM element into the latch, the second output node has the ground voltage if the NVM element is in a programmed threshold voltage state and the second output node has the operating voltage if the NVM element is in an erased threshold voltage state.

10. An operating method for a non-volatile shift register cell having a non-volatile memory (NVM) element, a latch, a reset transistor, a first switch and a second switch, the latch having at least an input node, a first output node and a second output node, the input node and the first output node being complementary to each other, one of two source/drain electrodes of the NVM element being coupled to the first output node, the first switch and the second switch being connected in series at an intermediate node, the reset transistor and an output terminal of the two switches being coupled to the second output node, the intermediate node being coupled to the input node, the operating method comprising:
   resetting the second output node to a predetermined voltage by the reset transistor;
   when the NVM element is N-type, loading an non-volatile value from the NVM element into the latch by applying a control gate voltage to a control gate of the NVM element and applying a ground voltage to the other source/drain electrode of the NVM element;
   when the NVM element is P-type, loading the non-volatile value from the NVM element into the latch by applying an operating voltage to the control gate, the other source/drain electrode and a well electrode of the NVM element;
   passing an input voltage at an input terminal of the two switches to the intermediate node by the two switches according to a clock signal; and
   coupling the intermediate node to the second output node by the two switches according to the clock signal;
   wherein the control gate voltage is between an erased threshold voltage and a programmed threshold voltage of the NVM element.

11. The method according to claim 10, wherein the step of passing the input voltage comprises:
   enabling the first switch to pass the input voltage to the intermediate node according to a first state of the clock signal; and
   disabling the second switch according to the first state of a clock signal.

12. The method according to claim 11, further comprising:
   causing the second output node to have the input voltage by the latch after the step of passing the input voltage.

13. The method according to claim 10, wherein the step of coupling comprises:
   disabling the first switch according to a second state of the clock signal; and
   enabling the second switch to couple the intermediate node to the second output node according to the second state of the clock signal.

14. The method according to claim 10, wherein the step of resetting comprises:
   when the reset transistor is N-type, applying the operating voltage to a gate of the reset transistor to reset the second output node to the ground voltage; and
   when the reset transistor is P-type, applying the ground voltage to the gate of the reset transistor to reset the second output node to the operating voltage.

15. The method according to claim 10, wherein the NVM element is N-type, and wherein when the NVM element is in a programmed threshold voltage state, the NVM element is turned off, otherwise the NVM element is turned on during e step of loading the non-volatile value from the NVM element into the latch.

16. The method according to claim 10, wherein the NVM element is P-type, and wherein when the NVM element is in a programmed threshold voltage state, the NVM element is turned on, otherwise the NVM element is turned off during the step of loading the non-volatile value from the NVM element into the latch.

17. The method according to claim 10, further comprising:
   when the NVM element is in a programmed threshold voltage state, causing the second output node to have the ground voltage, otherwise causing the second output node to have the operating voltage after the step of loading the non-volatile value from the NVM element into the latch and prior to the steps of passing and coupling.

* * * * *